United States Patent [19]
Adler et al.

[11] Patent Number: 5,252,848
[45] Date of Patent: Oct. 12, 1993

[54] LOW ON RESISTANCE FIELD EFFECT TRANSISTOR

[75] Inventors: Steven J. Adler; Robert B. Davies, both of Tempe; Stephen J. Nugent, Phoenix; Hassan Pirastehfar, Mesa, all of Ariz.

[73] Assignee: Motorola, Inc., Schaumburg, Ill.

[21] Appl. No.: 829,190

[22] Filed: Feb. 3, 1992

[51] Int. Cl.⁵ .................. H01L 29/78; H01L 29/10
[52] U.S. Cl. .................. 257/328; 257/335; 257/339
[58] Field of Search ............. 357/23.3, 23.4; 257/325, 335, 339

[56] References Cited
U.S. PATENT DOCUMENTS

| | | | |
|---|---|---|---|
| 4,679,171 | 7/1987 | Logwood et al. | 365/154 |
| 4,757,032 | 7/1988 | Contiero | 437/162 |
| 4,924,277 | 5/1990 | Yamane et al. | 357/233 |

OTHER PUBLICATIONS

Abbas et al., 'Substrate Current Mem Cell', IBM Tech vol. 19, No. 8, Jan. 77, pp. 3030–3031.
'Selective Ox of Titanium . . . ', IBM Tech, vol. 27, No. 10A, Mar. 85, pp. 5870–5875.
Itoh et al., 'Extremely High Efficient UHF Power MOSFET . . . ' IEDM, 1983, pp. 83–97.

Primary Examiner—Andrew J. James
Assistant Examiner—Stephen D. Meier
Attorney, Agent, or Firm—Joe E. Barbee; Robert F. Hightower

[57] ABSTRACT

A performance enhancing conductor (27) is employed to reduce a transistor's (10) on resistance and to also reduce the transistor's (10) parasitic gate to drain capacitance (32). The performance enhancing conductor (27) covers the transistor's (10) gate (22) and a portion of the drain region (18, 19) that is adjacent the transistor's channel (20). The performance enhancing conductor (27) is isolated from the gate (22) by an insulator (24, 26).

13 Claims, 1 Drawing Sheet

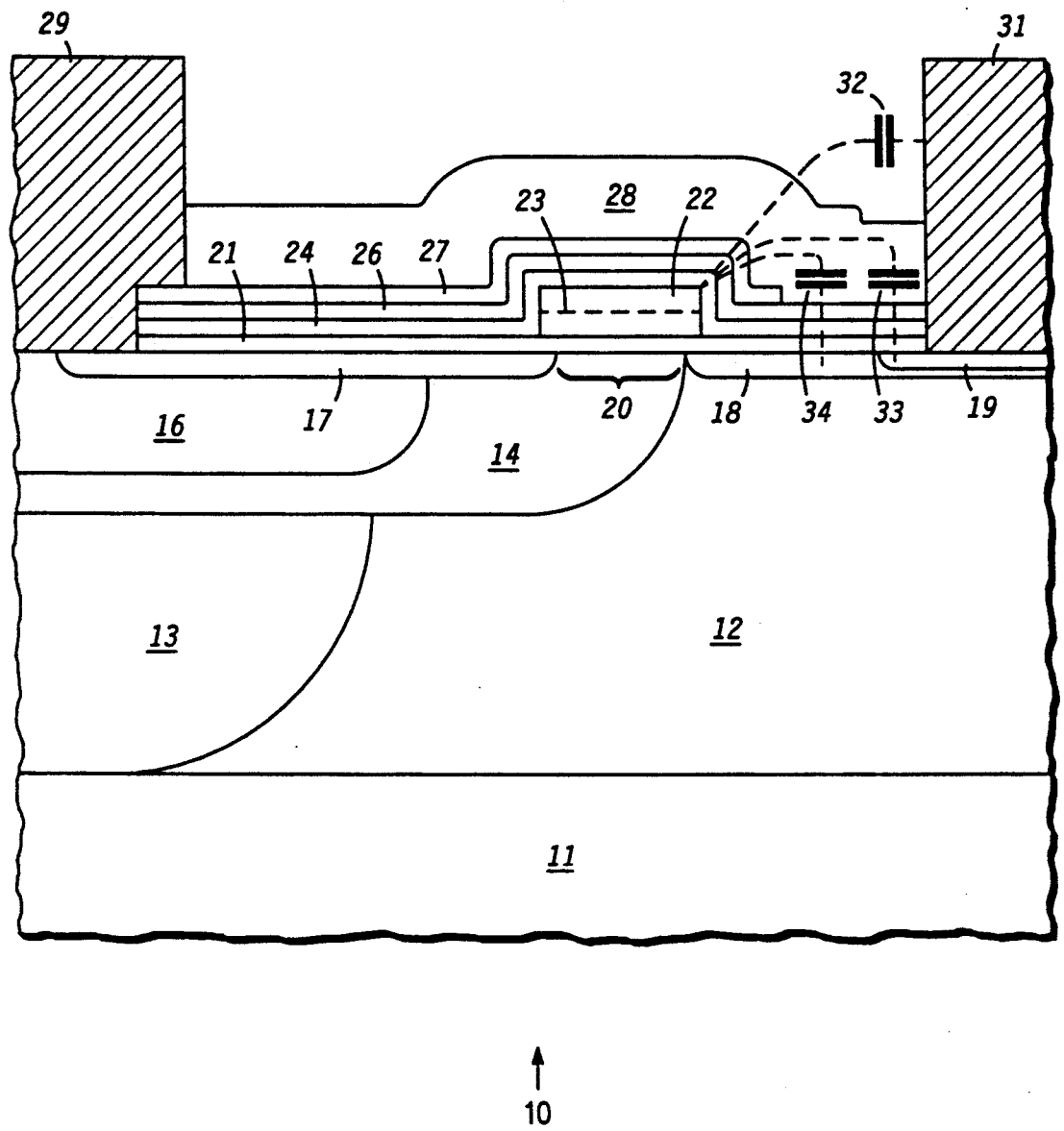

LOW ON RESISTANCE FIELD EFFECT TRANSISTOR

This application is related to application Ser. No. 07/670,654, now U.S. Pat. No. 5,155,563, for Davies et al filed Mar. 18, 1991 and entitled "Semiconductor Device Having a Low Source Inductance" which has some common inventors.

BACKGROUND OF THE INVENTION

The present invention relates, in general, to semiconductor devices, and more particularly, to a novel field effect transistor (FET) that has a low "on" resistance.

In the past, the semiconductor industry has made field effect transistors, such as RF transistors, that have a backside or substrate source contact. The transistor's substrate source contact permits attaching the substrate to a grounded heat sink thereby providing a low thermal resistance. Such a low thermal resistance facilitates forming a high power dissipation semiconductor package. Additionally, the substrate source contact eliminates the need for a source wire bond thereby reducing the transistor's source inductance.

One disadvantage of these prior transistors is a high source to drain resistance, commonly referred to as the on resistance. For example, a transistor having a saturated output power of approximately two watts has a typical on resistance of one ohm or greater. The high on resistance results in undesirable power dissipation that limits the transistor's peak output power. In addition, these prior MOS transistors have a high gate to drain capacitance. For the example of the two watt transistor, the typical gate to drain capacitance is approximately 2.8 picofarads or greater. The high capacitance limits the transistor's high frequency stability thereby limiting the transistor's maximum operating frequency.

Accordingly, it is desirable to have a field effect transistor that has a low on resistance (less than approximately one ohm), and that has a low gate to drain capacitance (less than approximately 2.8 picofarads).

SUMMARY OF THE INVENTION

Briefly stated, the present invention includes a field effect transistor that has a performance enhancing conductor which covers the transistor's gate and is isolated from the gate by an insulator. The performance enhancing conductor reduces the on resistance of the transistor while also reducing the transistor's parasitic gate to drain capacitance.

As used herein the word(s) "one ohm" and "2.8 picofarads" are typical values for a transistor having a typical saturated output power of approximately two (2) watts. Lower wattage transistors typically have higher resistance and lower capacitance values.

BRIEF DESCRIPTION OF THE DRAWINGS

The sole Figure illustrates an enlarged cross-sectional view of a field effect transistor in accordance with the present invention.

DETAILED DESCRIPTION OF THE DRAWINGS

The sole Figure illustrates a transistor 10 that includes a performance enhancing conductor 27. Conductor 27 functions to provide transistor 10 with a low on resistance and a small gate to drain capacitance. In the preferred embodiment, transistor 10 has a channel 20 that is doped P-type although it will hereinafter be apparent to those skilled in the art that transistor 10 is not limited to the doping or conductivity types described in the preferred embodiment. Transistor 10 includes a substrate 11 which facilitates forming a substrate source contact as will be seen hereinafter. An epitaxial layer 12 covers substrate 11 and includes a source continuity region 13. Although not shown, region 13 extends to a first surface of transistor 10 in order to form an electrical connection to a source electrode 29. Region 13 and source electrode 29 provide a low resistance connection between substrate 11 and a source 17 thereby permitting substrate 11 to function as a source contact. In the preferred embodiment, substrate 11 and layer 12 are both P-type, while region 13 is heavily doped P-type in order to form the low resistance path to the substrate.

A drain region of transistor 10 is formed by a lightly doped drain breakdown tub 18 in combination with a more heavily doped drain 19 that is within tub 18. In the preferred embodiment, the drain region is formed by doping tub 18 as N-type and doping drain 19 as heavily doped N-type. In addition, source 17 is also doped N-type. A portion of a high voltage breakdown tub 14 forms channel 20 between source 17 and tub 18. The preferred embodiment of tub 14 is P-type which, in combination with tub 18, assists in increasing the breakdown voltage of transistor 10. Also in this preferred embodiment the portion of tub 14 under gate 22 has a graded doping profile that gradually decreases laterally across tub 14 with the peak concentration being in the portion of tub 14 that is not covered by gate 22. The preferred embodiment also has drain 19 less than approximately 2.0 microns from tub 14. An enhancement tub 16 that is positioned within tub 14 forms an ohmic contact with source electrode 29 and facilitates forming a low resistance path between substrate 11 and source electrode 29. In the preferred embodiment, tub 16 is heavily doped P-type and enhances the stability of transistor 10 by lowering the series base resistance of a parasitic bipolar transistor that is formed by tub 18, tub 14, and source 17. A drain electrode 31 provides a low resistance ohmic contact to drain 19.

A gate electrode 22 that overlays channel 20 is separated from channel 20 by a gate oxide 21. Gate electrode 22 can have a variety of configurations including, but not limited to, a layer of polysilicon, or a layer of polysilicon that is covered by a gate silicide layer as illustrated by a dashed line 23. Although silicide generally has a lower resistance than polysilicon, silicide does not readily adhere to gate oxide 21, thus, the polysilicon functions as an intermediate layer that bonds to both the silicide and to gate oxide 21. In the preferred embodiment, gate electrode 22 is approximately 2500 angstroms (Å) of polysilicon that is covered with approximately 2500 Å of tungsten silicide (WSi). The two layer implementation of gate 22 forms a low resistance gate that has a lower profile than is provided by a single layer polysilicon gate of equivalent resistance. Gate 22 is electrically isolated from performance enhancing conductor 27 by an insulator. Although the insulator may have various configurations, it will be seen hereinafter that it is important that the insulator be as thin as possible on the drain side of gate 22 in order to minimize the distance from the sidewall of gate 22 to conductor 27 and also from tub 18 to conductor 27. The preferred embodiment of the insulator is a low temperature thermal oxide 24 that is covered by a layer of silicon nitride 26. Silicon nitride 26 provides a highly reliable and substantially defect free insulator that prevents contaminants from affecting the operation of transistor 10. Oxide 24 functions as a stress relief that prevents silicon nitride 26 from damaging gate oxide 21.

It has been found that conductor 27 reduces the parasitic gate to drain capacitance of transistor 10. During normal operation, fringing electric fields emanating from gate 22 capacitively couple gate 22 to electrode 31, to tub 18, and to drain 19 thereby forming a parasitic gate to drain capacitance that is represented by the combination of a capacitor 32, a capacitor 33, and a capacitor 34. The connections to capacitors 32, 33, and 34 are are shown as dashed lines to indicate that capacitors 32, 33, and 34 are parasitic capacitors. It is believed that conductor 27 substantially terminates these electric field lines thereby minimizing the gate to drain capacitance of transistor 10. In order to maximize the termination effect of conductor 27, conductor 27 should cover gate 22 and be as close to the intersection of channel 20 and tub 18 as possible at least near the intersection of channel 20 and tub 18. Since conductor 27 minimizes the capacitive coupling between drain 19 and gate 22, drain 19 can be close to channel 20 thereby reducing the on resistance of transistor 10.

In addition, it has been found that performance enhancing conductor 27 reduces the on resistance of transistor 10. Since conductor 27 minimizes the capacitive coupling between drain 19 and gate 22, drain 19 can be close to channel 20 thereby reducing the on resistance of transistor 10.

Thus, to effectively reduce both the on resistance and the gate to drain capacitance of transistor 10, oxide 24 and silicon nitride 26 should be as thin as possible at least near the intersection of channel 20 and tub 18. In the preferred embodiment, oxide 24 has a thickness between approximately 500 Å and 2000 Å, and silicon nitride 26 has a thickness that is less than approximately 1000 Å.

The effectiveness of conductor 27 is enhanced by electrically connecting conductor 27 to a potential that is lower than the potential applied to electrode 31 and gate 22, such as source electrode 29. Conductor 27 can be electrically connected to electrode 29 by a variety of routes as long as conductor 27 covers gate 22 and overlays the intersection of channel 20 and tub 18. In addition, it is desirable that conductor 27 have a low resistivity, preferably less than approximately 100 ohms per square. In the preferred embodiment, the electrical connection is formed by extending conductor 27, oxide 24, silicon nitride 26, and gate oxide 21 to intersect source electrode 29. Also, in this preferred embodiment, conductor 27 is formed from doped polysilicon. Once conductor 27 is complete, a dielectric 28 is formed to cover the portion of transistor 10 that is between electrodes 29 and 31.

It should be noted that positioning conductor 27 near the upper surface of gate 22 increases the gate to source capacitance of transistor 10. Since the gate to source capacitance has a minimal affect on the high frequency stability, this often is not important. In addition, the gate to source capacitance can be easily tuned out of a high frequency circuit thereby further reducing the gate to source capacitance's effect. The value of the gate to source capacitance can be minimized by increasing the distance between conductor 27 and the upper surface of gate 22. For such a configuration, the portion of the insulator above gate 22 is formed to have a thickness in excess of 3000 Å thereby reducing the gate to source capacitance of transistor 10. The portion of conductor 27 overlying source 17 has substantially no affect on the gate to source capacitance.

By way of example, a transistor, such as transistor 10, but without conductor 27 is formed to have a typical saturated power output of approximately 2.0 watts. When biased in the active region, the transistor's on resistance is typically about one ohm, and the gate to drain capacitance of is approximately 2.8 picofarads. By comparison, a transistor 10 having a typical saturated power output of approximately 2.0 watts and that includes conductor 27 has an on resistance of approximately 0.19 ohms, and a gate to drain capacitance of approximately 0.4 picofarads. Consequently, conductor 27 reduced the on resistance of transistor 10 by approximately thirty-five percent (35%) and reduced the gate to drain capacitance by approximately eighty-five (85%) percent.

By now it should be appreciated that there has been provided a novel way to improve the performance of a field effect transistor. A performance enhancing conductor, such as conductor 27, that overlays the transistor's gate electrode and a portion of the drain region, effectively reduces the transistor's on resistance in addition to the gate to drain capacitance. The reduced on resistance facilitates increasing the transistor's drain current without increasing the transistor's power dissipation thereby increasing the peak output power the transistor can supply to a load. The increased output power provides improved transmission quality in RF amplifiers and extended battery life in portable communication equipment. In addition, the reduced gate to drain capacitance increases the transistor's stability and permits stable operation at higher frequencies.

We claim:

1. A low on resistance field effect transistor comprising:

a semiconductor substrate having a first surface;

a high voltage breakdown tub on the first surface wherein the high voltage breakdown tub is of a first conductivity type;

a drain breakdown tub on the first surface and adjacent to the high voltage breakdown tub wherein the drain breakdown tub is of a second conductivity type;

a source of the second conductivity type wherein the source is within the high voltage breakdown tub and is a predetermined distance from the drain breakdown tub and wherein the predetermined distance forms a channel;

a drain within the drain breakdown tub wherein the drain is a heavily doped portion of the drain breakdown tub and is less than approximately 2 microns from the channel;

a gate oxide that is on the first surface and overlays the channel, a portion of the source, and a portion of the drain breakdown tub;

a gate electrode that is on the gate oxide and overlays the channel;

a dopant within the high voltage breakdown tub wherein the dopant has a doping concentration that gradually decreases laterally across a portion of the high voltage breakdown tub underlying the gate electrode and a peak doping concentration in a portion of the high voltage breakdown tub underlying the source;

a silicon dioxide stress relief layer that covers the gate electrode and a portion of the gate oxide that overlays the drain breakdown tub;

a silicon nitride layer covering the stress relief layer; and a conductor on the silicon nitride layer with the conductor overlying the gate electrode and a portion of the drain breakdown tub wherein the conductor minimizes capacitive coupling between the drain and the gate.

2. The transistor of claim 1 wherein the silicon nitride layer is not greater than 1000 Å thick.

3. The transistor of claim 1 wherein the conductor includes doped polysilicon that has a resistivity that is not greater than 100 ohms per square.

4. The transistor of claim 1 wherein the gate electrode includes a layer of polysilicon that is covered by a silicide layer.

5. The transistor of claim 4 wherein the silicide layer includes tungsten silicide.

6. The transistor of claim 1 wherein the silicon dioxide that covers the gate electrode and the silicon nitride covering the silicon dioxide that covers the gate electrode have a combined thickness that is greater than 3000 Å in order to reduce the capacitive coupling.

7. A transistor comprising:
a channel of a first conductivity type;
a source of a second conductivity type adjacent an edge of the channel;
a drain region adjacent an edge of the channel that is opposite the source wherein the drain region is of the second conductivity type;
a gate oxide overlying the channel;
a gate electrode on the gate oxide and overlying the channel;
an insulator covering the gate electrode; and
a conductor on the insulator wherein the conductor overlies the gate electrode and a portion of the drain region that does not underlie the gate electrode in order to terminate electric field lines between the gate electrode and the drain region.

8. The transistor of claim 7 wherein the gate electrode includes a layer of polysilicon covered by a silicide layer.

9. The transistor of claim 8 wherein the silicide layer includes a tungsten silicide layer.

10. The transistor of claim 7 wherein the insulator includes a silicon dioxide stress relief layer.

11. The transistor of claim 7 wherein the insulator includes a silicon nitride layer not greater than 1000 Å thick.

12. The transistor of claim 7 wherein the conductor includes a layer of doped polysilicon.

13. The transistor of claim 12 wherein the doped polysilicon has a resistivity that is not greater than 100 ohms per square.

* * * * *